(12) United States Patent
Soh

(10) Patent No.: US 6,485,310 B2
(45) Date of Patent: Nov. 26, 2002

(54) ASSEMBLY INCLUDING A FLEX CIRCUIT AND A GAS TIGHT CHAMBER

(75) Inventor: Lip-Teck Soh, Singapore (SG)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/798,735

(22) Filed: Mar. 2, 2001

(65) Prior Publication Data

US 2001/0014547 A1 Aug. 16, 2001

Related U.S. Application Data

(63) Continuation of application No. 09/503,367, filed on Feb. 14, 2000, now Pat. No. 6,200,142.
(60) Provisional application No. 60/121,091, filed on Feb. 22, 1999.

(51) Int. Cl.$^7$ .................................................. H01R 9/09
(52) U.S. Cl. ........................................ 439/67; 439/926
(58) Field of Search ...................... 439/67, 66, 591, 439/77, 495, 271, 272, 274–276, 76.1, 926; 360/97.01, 97.02–97.04

(56) References Cited

U.S. PATENT DOCUMENTS

| | | | |
|---|---|---|---|
| 2,749,382 A | 6/1956 | Lockard | 174/71 |
| 4,597,617 A | 7/1986 | Enochs | 339/17 CF |
| 4,881,908 A | 11/1989 | Ferry et al. | 439/161 |
| 4,907,975 A | 3/1990 | Dranchak et al. | 439/67 |
| 5,045,921 A | 9/1991 | Lin et al. | 357/74 |
| 5,206,795 A | 4/1993 | Belanger, Jr. | 361/398 |
| 5,241,438 A * | 8/1993 | Matsushima | 360/105 |
| 5,314,342 A | 5/1994 | Figge | 439/66 |
| 5,573,409 A | 11/1996 | Shiley et al. | 439/76.01 |
| 6,097,087 A | 8/2000 | Farnworth et al. | 257/698 |

* cited by examiner

Primary Examiner—Renee Luebke
Assistant Examiner—Phuong Nguyen
(74) Attorney, Agent, or Firm—Perman & Green, LLP

(57) ABSTRACT

An assembly which a concave member and a first substrate having a transverse opening which is superimposed over the concave member to form an internal chamber. A second substrate having a transverse opening is also superimposed over said first substrate, and an electrical connector means is mounted on the second substrate. A flex circuit is interposed in spaced generally parallel relation between the first substrate and the concave member. An extension of the flex circuit extends through the transverse openings of the first and second substrate to engage the electrical connector means.

38 Claims, 5 Drawing Sheets

ASSEMBLY INCLUDING A FLEX CIRCUIT AND A GAS TIGHT CHAMBER

CROSS-REFERENCE TO RELATED APPLICATIONS

This application is a continuation of application Ser. No. 09/503,367 filed Feb. 14, 2000, now U.S. Pat. No. 6,200,142, which claims the benefit of U.S. Provisional application No. 60/121,091 filed Feb. 22, 1999.

BACKGROUND OF THE INVENTION

1. Field of the Invention

The present invention relates to flex circuit assemblies and more particularly to assemblies in which flex circuits are used to carry signals into and out of gas-tight chambers.

2. Brief Description of Earlier Developments

Direct access storage devices (DASD), or disk drives, store information on concentric tracks of a rotatable magnetic disk. In such devices flex circuits may extend out of gas tight chambers. Further efficiencies in integrating flex circuit and gas tight chambers are needed.

SUMMARY OF THE INVENTION

The present invention is an assembly in which a concave member and a first substrate having a transverse opening is superimposed over the concave member to form an internal chamber. A second substrate having a transverse opening is also superimposed over said first substrate, and an electrical connector means is mounted on the second substrate. A flex circuit is interposed in spaced relation between the first substrate and the concave member. An extension of the flex circuit projects through the transverse openings of the first and second substrate to engage the electrical connector means.

BRIEF DESCRIPTION OF THE DRAWINGS

The present invention is further described with reference to the accompanying drawings in which.

DETAILED DESCRIPTION OF THE PREFERRED EMBODIMENTS

Figure 1:
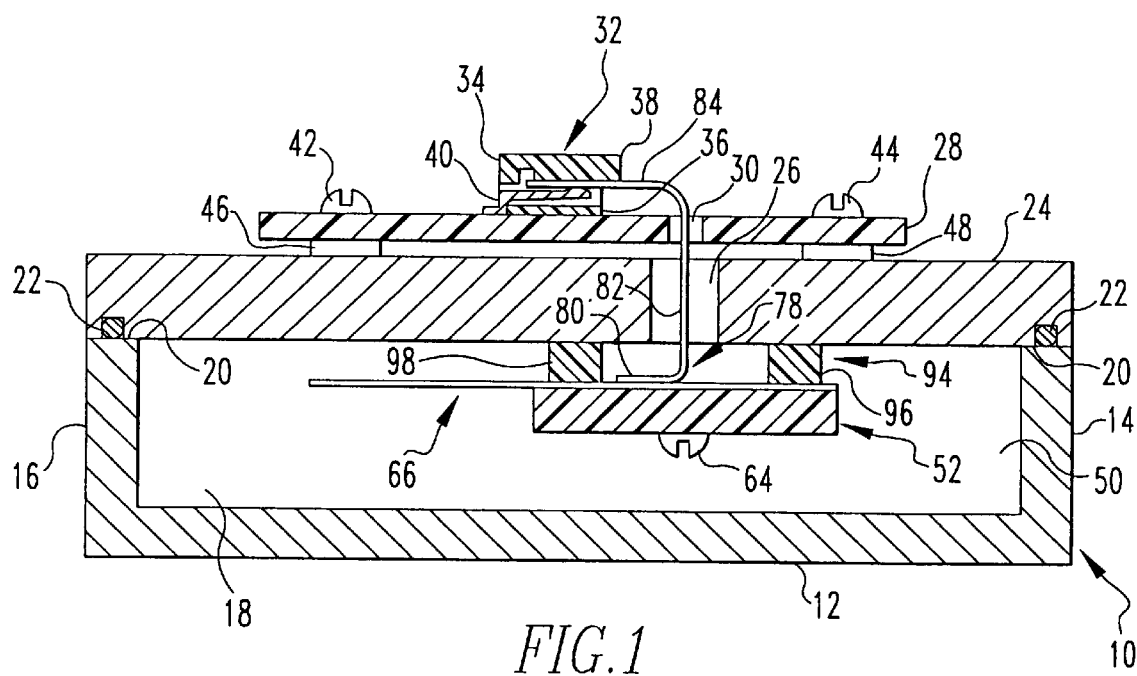
FIG. 1 is a longitudinal cross sectional view of an assembly representing a preferred embodiment of the present invention.
Figure 2:
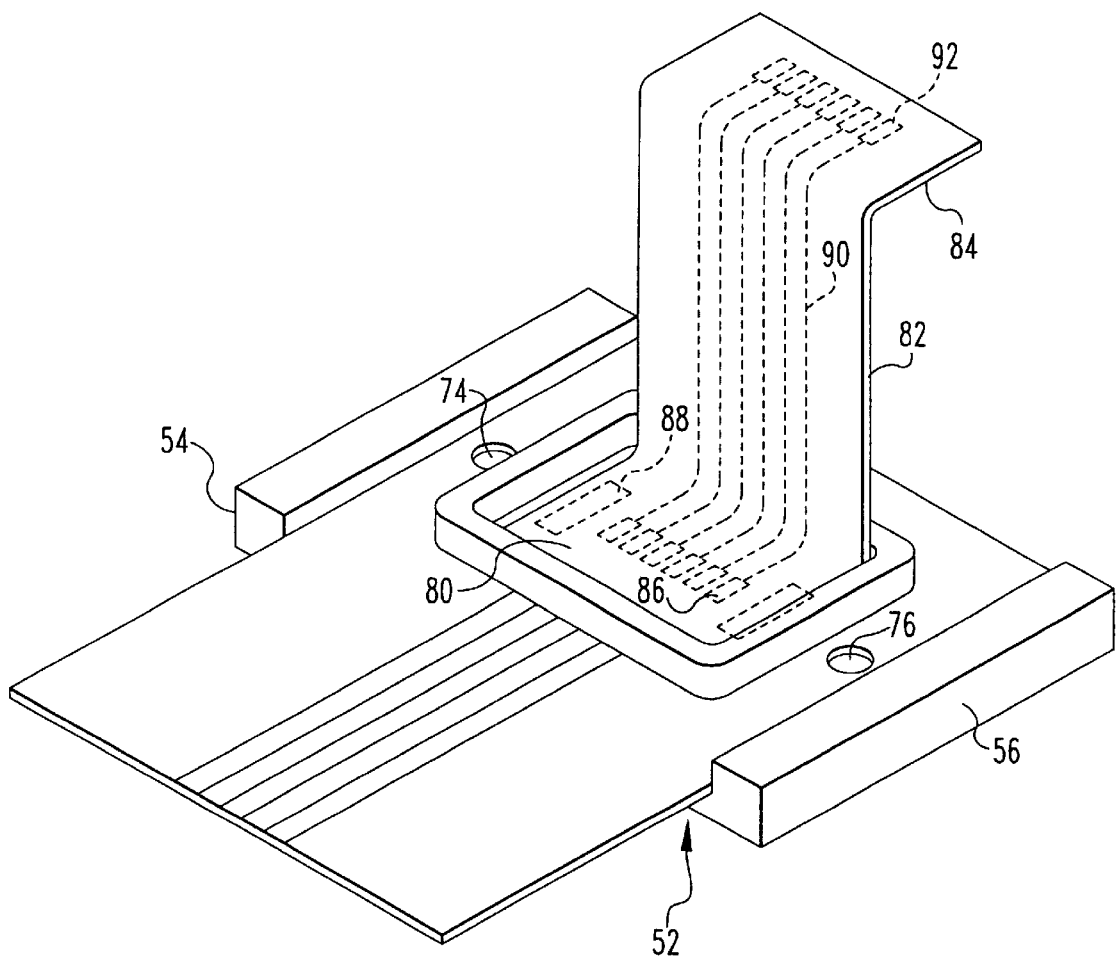
FIG. 2 is a perspective view of the flex circuits used in the assembly shown in FIG. 1 along with surrounding support and sealing components.
Figure 3:
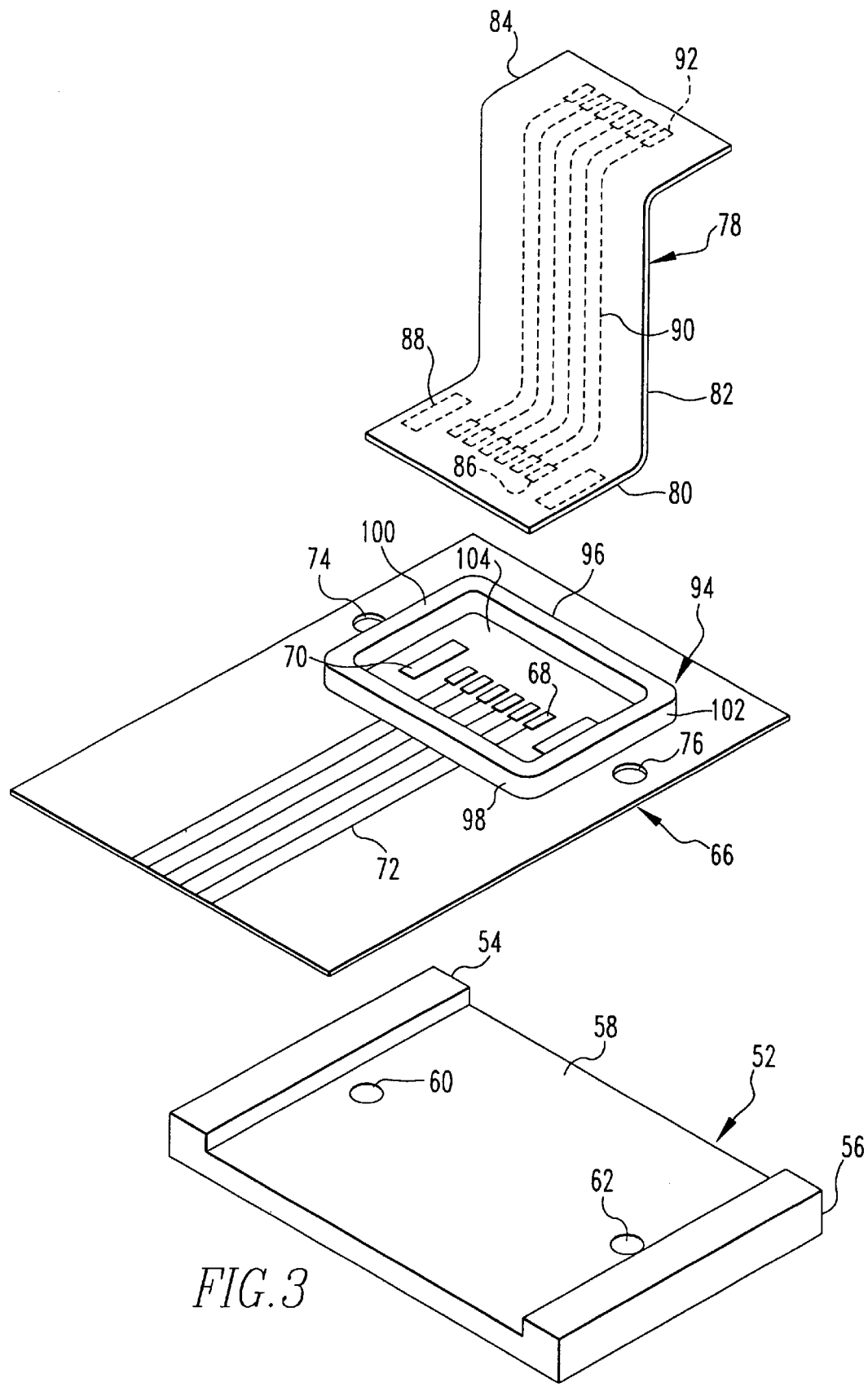
FIG. 3 is an exploded perspective view of the flex circuits and components shown in FIG. 2.

Referring to FIGS. 1–3, the assembly includes a concave plate shown generally at numeral 10 which is made up of a base wall 12 and a continuous peripheral wall which extend perpendicularly from the base wall and includes front wall 14, rear wall 16 and lateral walls as at lateral wall 18. This peripheral wall has an upper terminal edge 20 and a continuous seal 22 is positioned thereon. The assembly also includes a first substrate as at base plate 24 which is superimposed on the concave plate 10 so as to rest on the upper terminal edge 20 of the peripheral wall. The base plate 24 has a peripheral groove for accommodation of the continuous seal 22 which is interposed between the base plate and the peripheral wall on the cover plate 10. There is also a central transverse opening 26 in the base plate 12. A second substrate in the nature of a printed circuit board (PCB) 28 is positioned in parallel spaced relation to the base plate 24. The PCB 28 also has a central transverse opening 30 and an electrical connector shown generally at numeral 32 is mounted on its upper surface. The electrical connector 32 is comprised of an insulative housing having an upper wall 34 and a lower wall which rests directly on the PCB 28. A spacer member 38 has a solder tab (not shown) on its lower surface and is attached to the upper wall 34. Conductive terminal contacts 40 are interposed between the upper and lower walls of the connector. The PCB 28 is fastened to the base plate 24 by means of screws 42 and 44 and is spaced by means of spacers 46 and 48. Between the concave plate 10 and the base plate 24, there is a gas tight chamber 50. Inside the gas tight chamber there is a third substrate which is a stiffener plate 52. This stiffener plate has opposed side walls 54 and 56 and a flex circuit receiving reversed surface 58 which is interposed between the side walls. There are transverse apertures 60 and 62 through recessed surface 58, and stiffener plate 52 is attached by screws, as at screw 64, which pass through these apertures to the base plate 24. On the stiffener plate 52 there is a flex circuit 66, preferably extending in generally parallel relation between the first substrate 24 and concave plate 10, which has a plurality solder pads as at solder pads 68 and 70, and a plurality of conductive traces, such as trace 72. Also apertures 74 and 76 extend through the flex circuit for accommodation of fasteners as at screw 64 for mounting the flex circuit on the base plate 24. There is also a secondary flex circuit 78 which has a lower, preferably horizontal, section 80, an intermediate, preferably vertical, section 82 and an upper, preferably horizontal, section 84. On the lower section 80 there are a plurality of lower solder pads as at solder pad 86 and 88 which are connected to solder pads on the primary flex circuit 66 as at solder pad 68 and 70. As is conventional, the secondary flex circuit 78 also has a plurality of conductive traces as at trace 90 which conducts the lower solder pads to the upper solder pads as at upper solder pad 92 which is located on the upper section 84. The upper section 84 is interposed between the upper wall 34 and the lower wall 36 of connector 32 and in particular the solder pads as at solder pad 92 are fixed to spacer member 38 so that the conductive terminal contact as at contact 40 make electrical connections with conductive traces as at 90 on the secondary flex circuit. Surrounding the conjuncture of the primary and secondary flex circuit there is a gasket shown generally at 94 which has a front wall 96, a rear wall 98 and lateral walls 100 and 102. This gasket 94 forms a recess 104 which is exposed through opening 26 to the atomsphere which is separated from the gas tight chamber 50 between the concave plate 10 and the base plate 24.

Figure 4:
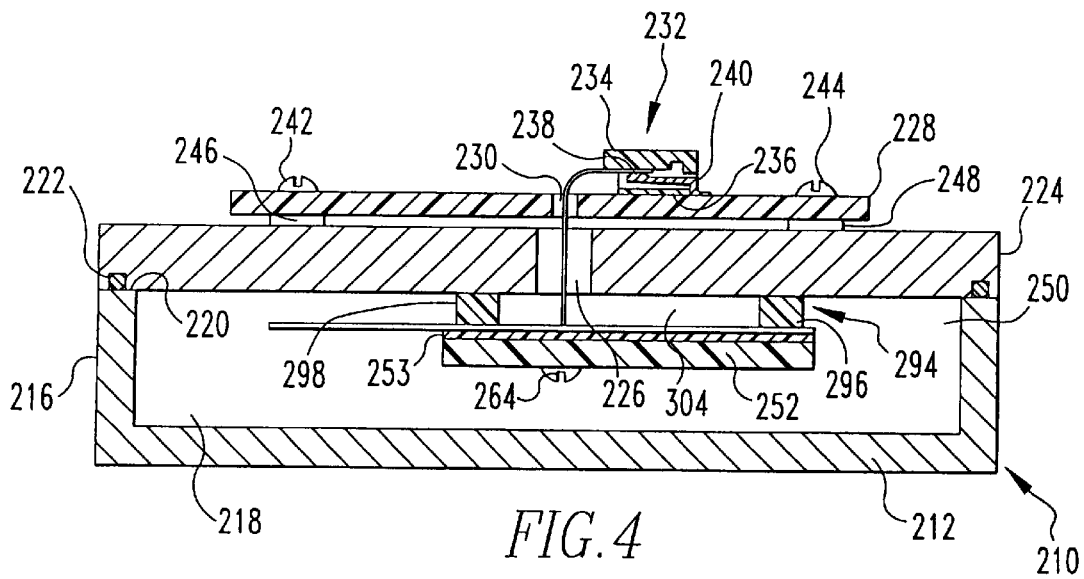
FIG. 4 is a longitudinal cross sectional view of an assembly representing an alternate preferred embodiment of the present invention.
Figure 5:
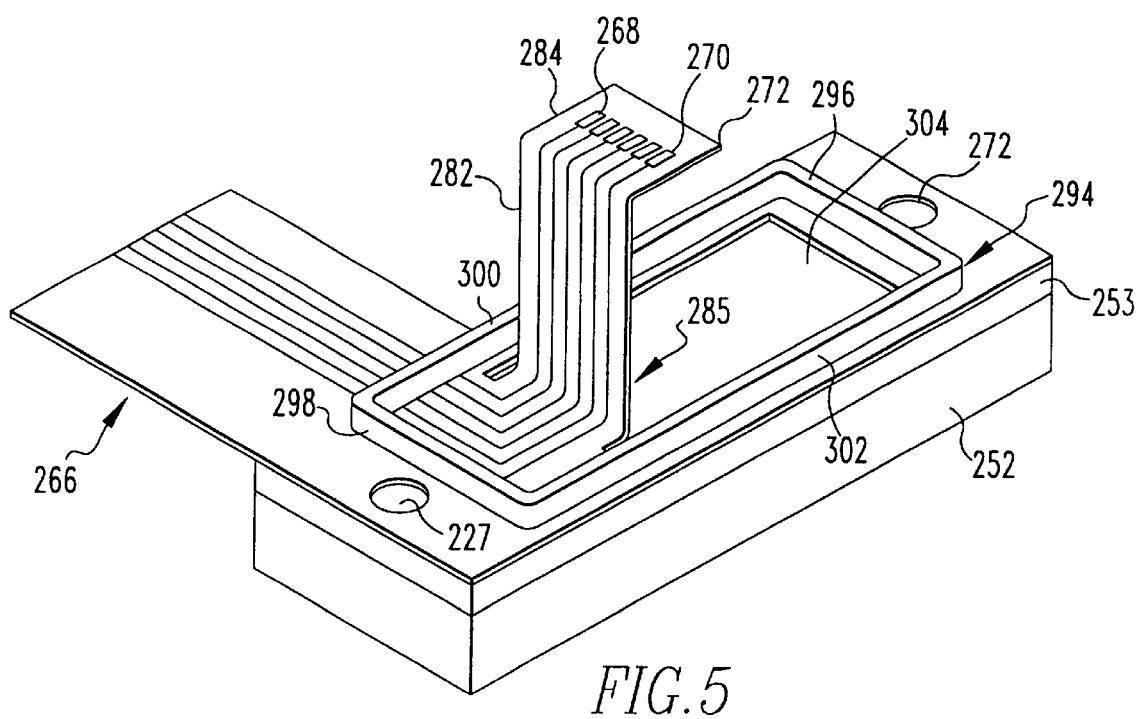
FIG. 5 is a perspective view of the flex circuit used the assembly shown in FIG. 4 along with surrounding support and sealing components.
Figure 6:
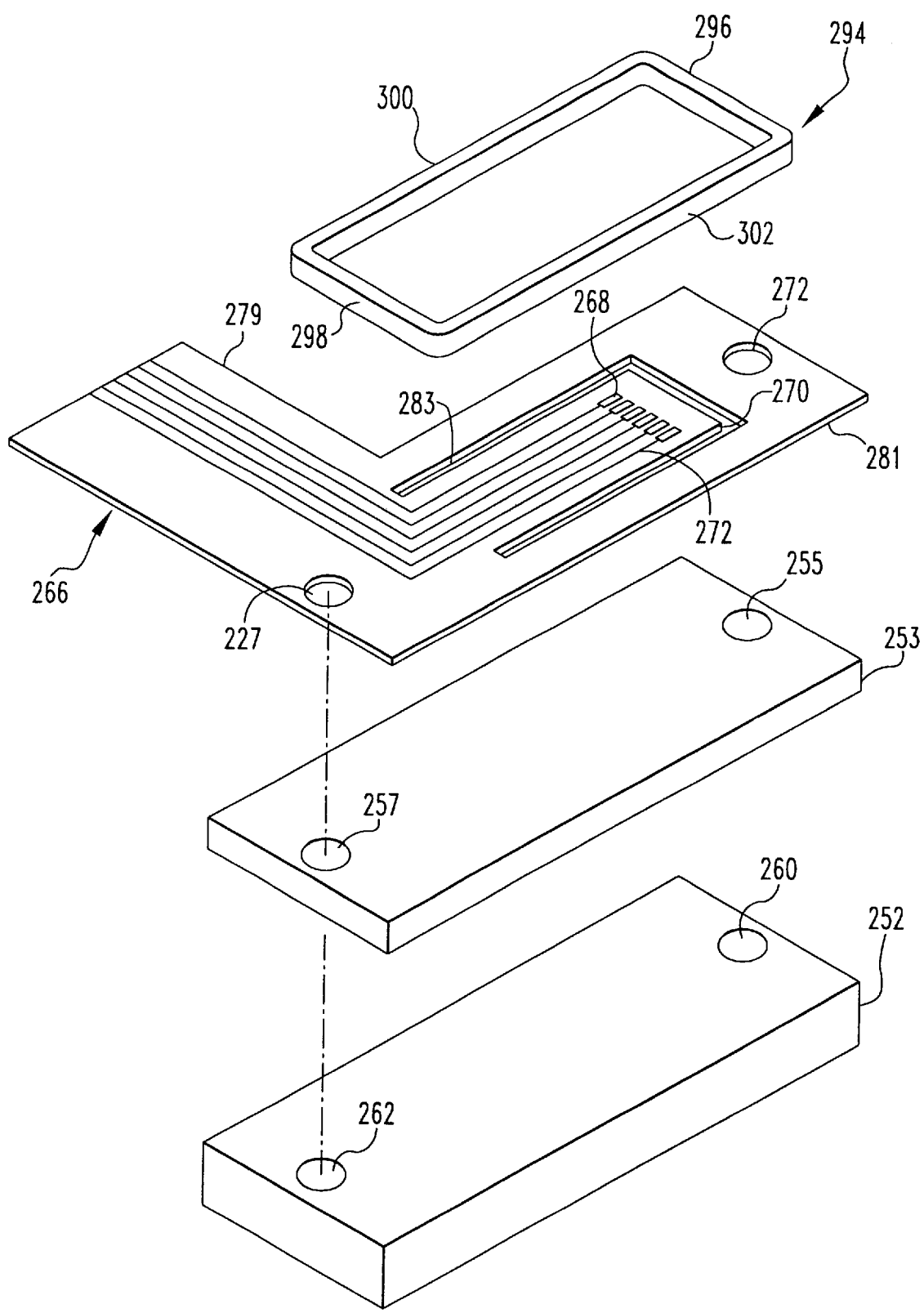
FIG. 6 is an exploded view of the flex circuit and the components shown in FIG. 5.

Referring to FIGS. 4–6, an alternate embodiment of the assembly includes a upper plate shown generally at numeral 210 which is made up of a base wall 212 and a continuous peripheral wall which extends perpendicularly from the base wall and includes front wall 214, rear wall 216 and lateral walls as at lateral wall 218. This peripheral wall has an upper terminal edge 220 with a continuous seal 222 positioned thereon. The assembly also includes a first substrate as at base plate 224 which is superimposed on the concave plate 210 so as to rest on the upper terminal edge 220 of the peripheral wall. The base plate 224 has a peripheral groove for accommodation of the continuous seal 222 which is interposed between the base plate and the peripheral wall on the cover plate 210. There is also a central transverse opening 226 in the base plate 212. A second substrate in the nature of a printed circuit board (PCB) 228 is positioned in parallel spaced relation to the base plate 224. The PCB 228 also has a central transverse opening 230 and an electrical connector shown generally at numeral 232 mounted on its upper surface. The electrical connector 232 is comprised of an insulative housing having an upper wall 234 and a lower wall 236 which rests directly on the PCB 228. A spacer member 238 has a solder tab (not shown) on its lower surface and is attached to the upper wall 234. Conductive contacts as at contact 240 are interposed between the upper and lower walls of the connector. The PCB 228 is fastened to the base plate 224 by means of screws 242 and 244 and is spaced from the base plate 224 by means of spacers 246 and 248. Between the concave plate 210 and the base plate 224, there is a gas tight chamber 250. Inside the gas tight chamber there is a third substrate which is a stiffener plate 252. Above the stiffener plate 252 there is a gasket 253 with transverse apertures 255 and 257. There are transverse apertures 260 and 262 through this stiffener plate 252 which is attached by screws as at screw 264 which pass through these apertures to the base plate 224. On the gasket 253 there is a flex circuit 266 which has a plurality solder pads as at solder pad 268 and 270 and a plurality of conductive traces as as base 272. Also apertures 274 and 276 extend through the flex circuit for accommodation of fasteners as at screw 264 for mounting the flex circuit on the base plate 224. The flex circuit 266 has a first leg 279 and a second leg 281. There is an extended slot 283 on the second leg 281 which forms a partially cutout section 283, having an upwardly extending, preferably vertical section 282 that extends through openings 226 and 230 and then engages connector 232 in upper, preferably horizontal section 284. The upper section 284 is interposed between the upper wall 284 and the lower wall 236 of connector 232 and in particular the solder pads as at solder pad 292 are fixed to the upper member 238, so that the conductive terminal contacts as at contact 240 make electrical connections with conductive traces as at 272 on the secondary flex circuit. Surrounding the slot 283 there is a gasket shown generally at 294 which has a front wall 296, a rear wall 298 and lateral walls 300 and 302. This gasket 294 forms a recess 304 which is exposed through opening 226 to the atomsphere which is separated from the gas tight chamber 250 between the concave plate 210 and the base plate 224.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A gas tight chamber and flex circuit assembly comprising:
   a frame forming a first interior gas tight area and a second separate interior area, the frame having a frame member with an aperture therethrough, the aperture extending into the second separate area, and the frame member bordering both the first and second areas;
   a first flex circuit extending through the aperture into the second separate area; and
   a second flex circuit electrically connected to the first flex circuit at a connection in the second area.

2. A gas tight chamber and flex circuit assembly as in claim 1 further comprising a printed circuit board stationarily connected to the frame member, wherein the printed circuit board comprises a hole, and wherein the flex circuit extends from a first side of the printed circuit board, through the hole, to a second side of the printed circuit board, and wherein the flex circuit is connected to an electrical connector on the second side of the printed circuit board.

3. A gas tight chamber and flex circuit assembly as in claim 1 wherein the frame further comprises a second frame member connected to the first frame member, the second frame member having a concave shape.

4. A gas tight chamber and flex circuit assembly as in claim 3 wherein the first frame member is connected to an edge of a peripheral wall of the second frame member with a seal therebetween.

5. A gas tight chamber and flex circuit assembly as in claim 1 wherein the frame further comprises a stiffener plate connected to the first frame member, and a gasket located between portions of the stiffener and the first frame member.

6. A gas tight chamber and flex circuit assembly as in claim 5 wherein the gasket is located around the aperture, wherein the gasket, the first frame member around the aperture and the flex circuit supported by the stiffener plate, define the second separate area, and wherein the gasket and the flex circuit seal off the second separate area from the first interior area.

7. A gas tight chamber and flex circuit assembly as in claim 5, wherein the second flex circuit extends between the gasket and the stiffener from the second area into the first area.

8. A gas tight chamber and flex circuit assembly as in claim 7 wherein the second flex circuit is located between the stiffener and the second area around a perimeter of the second area.

9. A gas tight chamber and flex circuit assembly comprising:
   a frame forming a first gas tight chamber;
   a first flex circuit extending from inside to outside the frame; and
   a printed circuit member connected to the flex circuit, the printed circuit member comprising an aperture with the flex circuit extending through the aperture.

10. A gas tight chamber and flex circuit assembly as in claim 9 wherein the frame forms a second interior chamber, isolated from the first gas tight chamber, wherein the frame comprises an open hole into the second chamber, and wherein the flex circuit extends through the open hole.

11. A gas tight chamber and flex circuit assembly as in claim 10 wherein the flex circuit extends from the first chamber into the second chamber, and wherein the flex circuit is sealed between the first and second chambers.

12. A gas tight chamber and flex circuit assembly as in claim 10 further comprising a second flex circuit electrically connected to the first flex circuit in the second chamber, the second flex circuit extending from the first chamber into the second chamber, and wherein the second flex circuit is sealed between the first and second chambers.

13. A gas tight chamber and flex circuit assembly as in claim 10 wherein the frame further comprises a gasket and a stiffener, and wherein the flex circuit, supported by the stiffener, and the gasket define the second chamber around the hole.

14. A gas tight chamber and flex circuit assembly as in claim 13 wherein the flex circuit extends between the gasket and the stiffener, and wherein the flex circuit separates the stiffener from the second chamber.

15. A gas tight chamber and flex circuit assembly comprising:
   a frame forming a first gas tight area and a second area substantially isolated from the first gas tight area;
   a flex circuit extending from the first gas tight area into the second area, and extending from the second area to an exterior side of the frame through an open hole in the frame; and
   a printed circuit member fixedly connected to the exterior side of the frame, wherein the flex circuit is electrically connected to the printed circuit member, and wherein the flex circuit extends around a perimeter of a boundary between the second area and the first gas tight area.

16. A gas tight chamber and flex circuit assembly as in claim 15 wherein the flex circuit comprises a first flex circuit member extending out of the open hole in the frame, and a second flex circuit member electrically connected to the first flex circuit member which extends between the first and second areas.

17. A gas tight chamber and flex circuit assembly as in claim 15 further comprising an electrical connector fixedly attached to an outer side of the printed circuit member, the connector having contacts electrically connected to contact pads on the flex circuit.

18. A gas tight chamber and flex circuit assembly comprising:
   a frame comprising a base and a cover, the frame forming an interior area;
   a flex circuit located in the interior area;
   a stiffener member located in the interior area and mounted to the frame; and
   a seal member located inside the interior area, wherein the flex circuit extends between the seal member and the stiffener member, and wherein the frame, the stiffener and the seal member form a gas tight chamber in the interior area.

19. A gas tight chamber and flex circuit assembly as in claim 18 wherein the frame comprises an open hole, wherein the flex circuit extends through the open hole, and wherein the seal member is spaced from the open hole.

20. A gas tight chamber and flex circuit assembly as in claim 18 wherein the interior area of the frame comprises the gas tight chamber and an isolated second chamber adjacent the gas tight chamber.

21. A gas tight chamber and flex circuit assembly as in claim 20 wherein the flex circuit extends from the gas tight chamber into the second chamber through a junction formed between the gas tight chamber and the second chamber and seals the junction between the gas tight chamber and the second chamber.

22. A gas tight chamber and flex circuit assembly as in claim 20 wherein the flex circuit comprises a first flex circuit member extending through an open hole in the frame, and a second flex circuit member electrically connected to the first flex circuit member, and wherein the second flex circuit member extends from the gas tight chamber into the second chamber.

23. A gas tight chamber and flex circuit assembly comprising:
   a frame comprising a cover connected to a base along a junction;
   at least one flex circuit, a first one of the flex circuits having a portion extending from inside the frame to outside the frame;
   a seal on the at least one flex circuit which seals off two sections of the flex circuit from each other in two separate areas inside the frame, the seal being located inside an interior area of the frame spaced from the junction;
   wherein the at least one flex circuit isolates one of the two separate areas from another.

24. A gas tight chamber and flex circuit assembly as in claim 23 further comprising a second seal at the junction between the cover and the base.

25. A gas tight chamber and flex circuit assembly as in claim 23 wherein the frame comprises a hole, wherein the first flex circuit extends out of the frame at the hole, and wherein the seal is spaced from the hole.

26. A gas tight chamber and flex circuit assembly as in claim 23 further comprising a stiffener connected to the cover and pressing the flex circuit against the seal around a border of one of the two separate areas.

27. A gas tight chamber and flex circuit assembly as in claim 23 wherein the two sections comprise a first gas tight chamber and a second chamber open to the outside of the frame by a substantially open aperture through the frame.

28. A gas tight chamber and flex circuit assembly as in claim 27 wherein a second one of the flex circuits is electrically connected to the first flex circuit, and wherein the second flex circuit extends into the gas tight chamber.

29. A gas tight chamber and flex circuit assembly as in claim 27 wherein the seal is spaced from the aperture through the frame.

30. A gas tight chamber and flex circuit assembly as in claim 27 wherein the first flex circuit extends into the gas tight chamber.

31. A gas tight chamber and flex circuit assembly comprising:
   a frame;
   at least one flex circuit, a first one of the flex circuits having a first portion which extends through a hole in the frame; and
   a seal on one of the flex circuits to form two areas inside the frame separated by the seal and the flex circuit, wherein the seal is spaced from the first portion of the first flex circuit where the first portion extends through the hole in the frame; wherein the seal is seated on the flex circuit around a perimeter of the seal.

32. A gas tight chamber and flex circuit assembly as in claim 31 wherein the seal is on a second portion of the first flex circuit.

33. A gas tight chamber and flex circuit assembly as in claim 31 wherein the seal is on a second one of the flex circuits, the second flex circuit being electrically connected to the first flex circuit.

34. A gas tight chamber and flex circuit assembly as in claim 31 wherein the first portion of the first flex circuit extends through the hole in the frame without a seal directly between the first portion and the frame at the hole.

35. A gas tight chamber and flex circuit assembly as in claim 31 wherein the two areas inside the frame comprise a gas tight area and an adjacent second area, the hole extending from inside to outside the frame from the second area, and wherein one of the flex circuits extends from the gas tight area into the second area.

36. A gas tight chamber and flex circuit assembly as in claim 31 wherein the first flex circuit comprises the first portion and a second portion, wherein the second portion comprises a closed loop section, and wherein the first portion extends from an inside edge of the loop section.

37. A gas tight chamber and flex circuit assembly as in claim 36 wherein the seal is directly on the closed loop portion of the first flex circuit.

38. A gas tight chamber and flex circuit assembly as in claim 37 further comprising a stiffener pressing the closed loop section of the first flex circuit against the seal, wherein the stiffener seals an opening through the closed loop section between the two areas.

* * * * *